(12) United States Patent
Price et al.

(10) Patent No.: US 7,868,799 B1
(45) Date of Patent: Jan. 11, 2011

(54) SYSTEM AND METHOD FOR REMOTING A PHOTONIC ANALOG-TO-DIGITAL CONVERTER

(75) Inventors: Alistair J. Price, Ellicott City, MD (US); Raymond Zanoni, Columbia, MD (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 78 days.

(21) Appl. No.: 12/387,707

(22) Filed: May 6, 2009

(51) Int. Cl.
*H03M 1/00* (2006.01)
(52) U.S. Cl. .......................... 341/137; 341/159
(58) Field of Classification Search .................. 341/137, 341/159
See application file for complete search history.

(56) References Cited

U.S. PATENT DOCUMENTS 6,118,396 A * 9/2000 Song ........................ 341/137
6,459,522 B2 * 10/2002 Yariv ........................ 359/264
6,525,682 B2 * 2/2003 Yap et al. .................... 341/137

OTHER PUBLICATIONS

Clark, Thomas R., et al., "Coherent Optical Phase-Modulation Link", IEEE Photonics Technology Letters, vol. 19, No. 16; Aug. 15, 2007; pp. 1206-1208.

* cited by examiner

*Primary Examiner*—Khai M Nguyen
(74) *Attorney, Agent, or Firm*—Matthew J. Evans; Daniel M. Barbieri

(57) ABSTRACT

The present invention is a remote input analog-to-digital conversion (ADC) system. The system may generate low jitter, short duration optical pulses to allow for high performance sampling of an antenna signal at a remote end of the system. The system may utilize phase modulation and IQ demodulation (with a reference optical pulse stream) using separate analog-to-digital converters for I and Q to overcome linearity limitations. Low sampling rate analog-to-digital converters may be utilized by the system by using parallel, low optical pulse repetition rate paths and/or optical demultiplexer switching trees. The system is an optical fiber system.

20 Claims, 10 Drawing Sheets

Power Dissipation Comparison

| Pulse rate at remote end (GHz) | Rep rate multiplier stages | No. of switches | No. of ADC's | MLL to phase modulator losses (dB) | Power Dissipation Comparison* |
|---|---|---|---|---|---|
| 40 | 4 | 15 | 32 | 15 | $P_{LNA} + 32 \cdot P_{ADC} + 15 \cdot P_{SW}$ |
| 20 | 3 | 14 | 32 | 15 | $2 \cdot P_{LNA} + 32 \cdot P_{ADC} + 14 \cdot P_{SW}$ |
| 10 | 2 | 12 | 32 | 15 | $4 \cdot P_{LNA} + 32 \cdot P_{ADC} + 12 \cdot P_{SW}$ |
| 5 | 1 | 8 | 32 | 15 | $8 \cdot P_{LNA} + 32 \cdot P_{ADC} + 8 \cdot P_{SW}$ |
| 2.5 | 0 | 0 | 32 | 12 | $16 \cdot P_{LNA} + 32 \cdot P_{ADC}$ |

*Approximate power dissipation comparison assuming the elements included dominate, and assuming the LNA dissipation increases linearly as the no. of phase modulators increases.

*FIG. 4*

SYSTEM AND METHOD FOR REMOTING A PHOTONIC ANALOG-TO-DIGITAL CONVERTER

FIELD OF THE INVENTION

The present invention relates to the field of advanced radio systems and particularly to system(s) and method(s) for remoting a photonic analog-to-digital converter (ADC) in order to sample radio frequency (RF) signals at an antenna.

BACKGROUND OF THE INVENTION

Current fiber optic data networks/fiber optic data network systems may not provide a desired level of performance.

Thus, it would be desirable to provide a fiber optic data network/fiber optic data network system which obviates problems associated with current solutions.

SUMMARY OF THE INVENTION

Accordingly, an embodiment of the present invention is directed to a method for sampling a remote input signal via a remote input analog-to-digital conversion (ADC) system, including: generating an optical sampling pulse stream, said optical sampling pulse stream having a first optical sampling rate; increasing said first optical sampling rate of the optical sampling pulse stream to a second optical sampling rate to provide a rate-multiplied optical sampling pulse stream; imparting voltage information of the remote input signal onto the rate-multiplied optical sampling pulse stream via phase modulation to provide a phase-modulated pulse stream; de-serializing the phase-modulated pulse stream to provide a plurality of parallel pulse streams; transmitting said parallel pulse streams to a plurality of optical hybrids of the system; generating reference pulses; transmitting said reference pulses to the plurality of optical hybrids; demodulating said parallel pulse streams via said optical hybrids to provide a plurality of demodulated signals; directing said demodulated signals to a plurality of optical detectors of the system; detecting said demodulated signals via said optical detectors to provide analog detected demodulated signals; directing said analog detected demodulated signals to a plurality of analog-to-digital converters of the system; converting said analog detected demodulated signals to digital signals; directing said digital signals to a digital signal processor of the system; and based on said digital signals, calculating phase values and reconstructing the voltage information of the remote input signal via said digital signal processor.

An additional embodiment of the present invention is directed to a method for sampling a remote input signal via a remote input analog-to-digital conversion (ADC) system, including: generating an optical sampling pulse stream; providing said optical sampling pulse stream to a plurality of phase modulators of the system; linearly imparting voltage information of the remote input signal onto the optical sampling pulse stream via phase modulation to provide a plurality of phase-modulated parallel pulse streams; providing the phase-modulated parallel pulse streams to a plurality of optical hybrids of the system; generating reference pulses; providing said reference pulses to the plurality of optical hybrids; utilizing said reference pulses to demodulate said phase-modulated parallel pulse streams via said optical hybrids to provide a plurality of demodulated signals; directing said demodulated signals to a plurality of optical detectors of the system; detecting said demodulated signals via said optical detectors to provide analog detected demodulated signals; transmitting said analog detected demodulated signals to a plurality of analog-to-digital converters of the system; converting said analog detected demodulated signals to digital signals; providing said digital signals to a digital signal processor of the system; and based on said digital signals, calculating phase values and reconstructing the voltage information of the remote input signal via said digital signal processor.

An additional embodiment of the present invention is directed to a method for sampling a remote input signal via a remote input analog-to-digital conversion (ADC) system, including: generating an optical sampling pulse stream, said optical sampling pulse stream having a first optical sampling rate; increasing said first optical sampling rate of the optical sampling pulse stream to a second optical sampling rate to provide a rate-multiplied optical sampling pulse stream; linearly imparting voltage information of the remote input signal onto the rate-multiplied optical sampling pulse stream via a plurality of phase modulators to provide a plurality of phase-modulated parallel pulse streams; de-serializing the phase-modulated pulse streams to provide a plurality of parallel pulse streams; providing said parallel pulse streams to a plurality of optical hybrids of the system; generating reference pulses; providing said reference pulses to the plurality of optical hybrids; demodulating said parallel pulse streams via said optical hybrids to provide a plurality of demodulated signals; providing said demodulated signals to a plurality of optical detectors of the system; detecting said demodulated signals via said optical detectors to provide analog detected demodulated signals; providing said analog detected demodulated signals to a plurality of analog-to-digital converters of the system; converting said analog detected demodulated signals to digital signals; providing said digital signals to a digital signal processor of the system; and based on said digital signals, calculating phase values and reconstructing the voltage information of the remote input signal via said digital signal processor.

An additional embodiment of the present invention is directed to a remote input analog-to-digital conversion (ADC) system, including: a mode-locked laser, said mode-locked laser configured for generating and transmitting an optical sampling pulse stream, said optical sampling pulse stream having a first optical sampling rate; a multiplier circuit, said multiplier circuit connected to the mode-locked laser, said multiplier circuit configured for receiving the transmitted optical sampling pulse stream and for increasing said first optical sampling rate of the optical sampling pulse stream to a second optical sampling rate to provide a rate-multiplied optical sampling pulse stream; a phase modulator, said phase modulator being remotely located from the multiplier circuit and being connected to the multiplier circuit, said phase modulator configured for receiving the rate-multiplied optical sampling pulse stream, said phase modulator further configured for imparting voltage information of a remote input signal onto the rate-multiplied optical sampling pulse stream to provide a phase-modulated pulse stream, wherein said remote input signal is received by the system; an optical demultiplexer switching tree, said optical demultiplexer switching tree being connected to the phase modulator and being configured for de-serializing the phase-modulated pulse stream to provide a plurality of parallel pulse streams; a plurality of optical hybrids, said optical hybrids being connected to the switching tree and being configured for receiving the parallel pulse streams via the switching tree, said optical hybrids further being connected to the mode-locked laser and being configured for receiving reference pulses from the mode-locked laser, said optical hybrids further configured for utilizing the reference pulses to demodulate the parallel pulse streams to provide a plurality of demodulated signals; a plurality of optical detectors, said optical detectors being connected to the plurality of optical hybrids and being configured for detecting the demodulated signals to provide analog detected demodulated signals; a plurality of analog-to-digital converters, said analog-to-digital converters being connected to the plurality of optical detectors, said converters being configured for converting said analog detected demodulated signals to digital signals; and a digital signal processor, said digital signal processor being connected to the plurality of converters, said processor being configured for, based on said digital signals, calculating phase values and reconstructing the voltage information of the remote input signal.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which:

FIG. 4 is table illustrating a power dissipation comparison for different implementations of the remote input ADC system of the present invention;

DETAILED DESCRIPTION OF THE INVENTION

Reference will now be made in detail to the presently preferred embodiments of the invention, examples of which are illustrated in the accompanying drawings.

Figure 1:
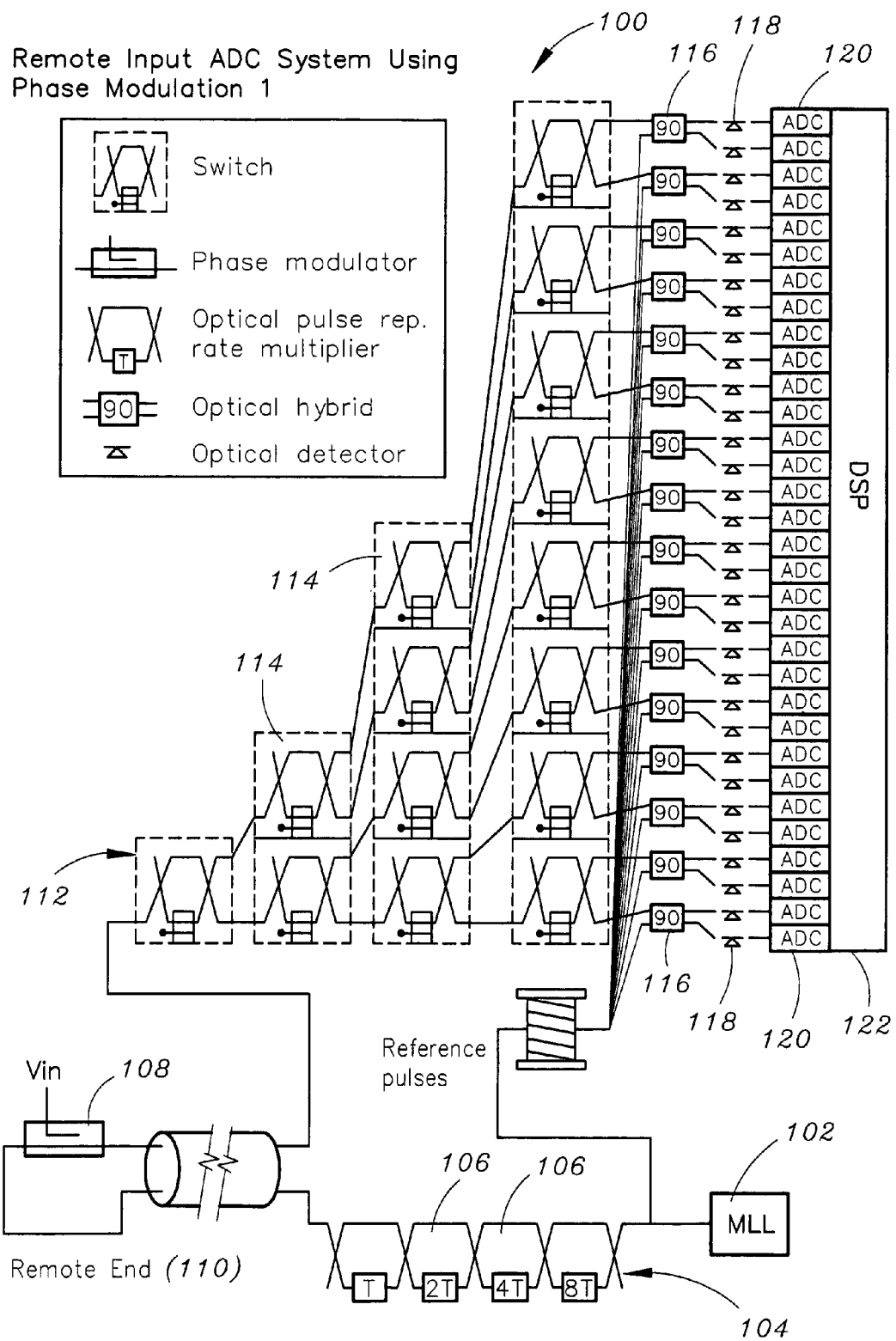
FIG. 1 is a block diagram schematic of a remote input analog-to-digital conversion (ADC) system in accordance with an exemplary embodiment of the present invention.

Referring to FIG. 1, a remote input analog-to-digital conversion (ADC) system/remote sensing ADC system in accordance with an exemplary embodiment of the present invention is shown. In the illustrated embodiment, the system 100 includes a mode-locked laser (MLL) 102. The MLL 102 is configured for generating optical sampling pulses/optical pulses/an optical sampling pulse stream. In exemplary embodiments, the optical sampling pulses may be low jitter, short duration optical sampling pulses. Further, in current embodiments of the present invention, the optical sampling pulses may have a pulse width of approximately three picoseconds (3 ps).

In current embodiments of the present invention, the system 100 may further include a multiplier circuit 104, which may be connected to the MLL 102. The multiplier circuit 104 may include one or more optical pulse repetition rate multipliers/cascaded pulse repetition rate multipliers/(split/delay/combine networks)/pulse repetition rate multipliers/repetition rate multiplier stages 106 (ex.—four multipliers). In further embodiments, the multiplier circuit 104 may be connected to a phase modulator 108 of the system 100, said phase modulator 108 being located at a remote end 110 of the system 100 (ex.—being remotely located from the multiplier circuit 104). The MLL 102 may be configured for providing the optical sampling pulses to the multiplier circuit 104 at a first optical pulse rate/first pulse repetition rate/first optical sampling rate. For example, the first optical pulse rate may be 2.5 Gigahertz.

In exemplary embodiments, the multiplier circuit 104 may be configured for receiving the optical sampling pulses/optical sampling pulse stream from/via the MLL 102 at the first optical pulse rate and transmitting/providing/outputting the optical sampling pulse stream/optical pulse stream at a second optical pulse rate/second optical sampling rate, said second optical pulse rate being greater than the first optical pulse rate. For example, the second optical pulse rate may be 40 GHz, while the first optical pulse rate (as mentioned above) may be 2.5 GHz. Thus, the multiplier circuit 104 may be configured for multiplying the optical pulse rate of the received optical sampling pulse stream, such that the first optical pulse rate (ex.—2.5 GHz) is increased to a required sampling rate/second optical pulse rate (ex.—40 GHz) and providing/outputting the optical sampling pulse stream as a rate-multiplied optical sampling pulse stream. Further, the rate-multiplied optical sampling pulse stream may have a pulse period of twenty-five picoseconds (T=25 ps).

In further embodiments of the present invention, the phase modulator 108 may be connected to the multiplier circuit 104 and may be configured for receiving the rate-multiplied optical sampling pulse stream from/via the multiplier circuit 104. Further, the phase modulator 108 may be configured for performing phase modulation of the rate-multiplied optical sampling pulse stream (ex.—linearly imparting voltage information onto the rate-multiplied optical sampling pulse stream) for providing phase modulated optical pulses/a phase-modulated pulse stream. For instance, the voltage information may be provided via an input signal(s)/Remote Input(s)/Input Voltage/Antenna Signal(s)/Remote Signal(s)/Analog Signal(s)/Analog Optical Transmission(s)/RF signal(s) received by the system 100. In exemplary embodiments, the phase modulator 108 may be a highly linear, broadband phase modulator 108 which may use the electro-optic effect in materials such as lithium niobate.

In exemplary embodiments, the system 100 may further include an optical demultiplexer switching tree(s)/an optical switching tree/de-serializer 112. The optical switching tree 112 may be connected to the phase modulator 108 and include one or more switches 114 (ex.—fifteen switches). In current embodiments of the present invention, the system 100 may further include one or more optical hybrids 116 (ex.—90 degree optical hybrids) connected to the optical switching tree 112.

In current embodiments of the present invention, the optical switching tree 112 may be configured for receiving the phase-modulated pulse stream from/via the phase modulator 108. The optical switching tree 112 may be further configured for outputting a plurality of parallel pulse streams based on/derived from (ex.—by splitting) the phase-modulated pulse stream. For example, each parallel pulse stream may have an optical pulse rate of 2.5 Gigahertz (GHz).

In further embodiments, each of the optical hybrid(s) 116 may be configured for receiving the parallel pulse stream(s) from/via the optical switching tree 112. The MLL 102 is connected to the optical hybrids and is configured for generating reference pulses. The optical hybrids 116 may be configured for receiving the reference pulses and for utilizing said reference pulses to demodulate the parallel pulse streams/parallel signals. Further, said reference pulses may be utilized by the system 100 to IQ detect the parallel pulse streams/parallel signals/optical pulses. Still further, the optical hybrids 116 are configured for outputting demodulated signals (ex.—I and Q signals/I and Q), said demodulated signals based upon/derived from the parallel pulse streams/parallel signals. In additional embodiments, the system 100 may further include a plurality of optical detectors 118. Further, the optical detectors 118 may be connected to the optical hybrids 116. Still further, the optical detectors 118 may be configured for receiving the demodulated signals/I and Q signals from/via the optical hybrids 116 (ex.—may be configured for detecting the demodulated signals).

In exemplary embodiments, the system 100 may further include a plurality of Analog-to-Digital Converters (ADCs) 120 (ex.—thirty-two ADCs). The ADCs 120 may be connected to the optical detectors 118. Further, the ADCs 120 may be configured for receiving the detected demodulated signals (ex.—detected I and Q signals) from/via the optical detectors 118. In the illustrated exemplary embodiment shown in FIG. 1, the system 100 may include sixteen optical hybrids 116, with each optical hybrid 116 outputting a pair of signals (ex.—an I signal and a Q signal/the I and Q signals/the demodulated signals). Further, the system 100 may include thirty-two optical detectors 118. Each detector 118 may be configured for detecting/receiving an I signal or a Q signal from/via the optical hybrids 116 and for providing the detected I signal or detected Q signal to an ADC 120 included in the plurality of ADCs 120. As mentioned above, each of the ADCs 120 may be configured for receiving the detected demodulated signals from/via the detectors 118. For instance, each ADC 120 may receive either a detected I signal or a detected Q signal from a detector 118 included in the plurality of detectors 118. Further, the ADCs 120 may be configured for converting the detected demodulated signals (ex.—analog detected demodulated signals) to digital signals. For example, each ADC 120 may receive either a detected I signal or a detected Q signal from a detector 118 included in the plurality of detectors 118 and may convert said detected I signal or detected Q signal to a digital signal. Thus, the ADCs 120 may convert the I and Q signals/analog I and Q signals separately. In exemplary embodiments, the system 100 may include filters/networks/amplifiers connected between the detectors 118 and the ADCs 120, through which said detected demodulated signals may be directed prior to being received by the ADCs 120.

In current embodiments of the present invention, the system 100 may include a digital signal processor (DSP) 122. The digital signal processor 122 may be connected to the plurality of ADCs 120. Further, the ADCs 120 may be configured for providing the converted signals/digital signals to the digital signal processor 122, which may be configured for receiving the converted signals/the digital signals from/via the ADCs 120. In exemplary embodiments, the DSP 122 may be configured for calculating phase values based on the digital signals/the digitized I and Q signals and, based on said digital signals, the DSP 122 may further be configured for reconstructing the voltage information of the input signal/RF signal received (ex.—sampled) by said system 100.

In further embodiments of the present invention, the system 100 may be an optical fiber system, thereby eliminating the need for metallic transmission media/metallic cable. Further, the system 100 of the present invention provides high bandwidth, high linearity and high dynamic range analog-to-digital conversion of remote signals. For instance, by using phase modulation and IQ demodulation (via a reference optical pulse stream) and by using separate ADCs 120 for I and Q, the system 100 of the present invention may overcome linearity limitations which are often encountered in analog optical transmission systems which use intensity modulation. Further, the system 100 may implement parallel low optical pulse repetition rate paths and/or optical demultiplexer switching trees 112, which may allow the system 100 to implement low sampling rate/low sampling clock rate ADCs 120. Further, the system 100 of the present invention may be implemented with a remote antenna system (ex.—up to 50 meters distance with 10 Gigahertz bandwidth and 10 Effective Number of Bits (ENOB)). Further, the system 100 of the present invention may require that the phase modulated optical pulses be aligned in time with the reference pulses in order to provide the above-reference analog-to-digital conversion functionality.

In exemplary embodiments of the present invention, the pulse repetition rate of the optical sampling pulses generated by the MLL 102 may correspond to the sampling clock rate of the ADCs 120, thereby promoting high performance sampling of the antenna signal (ex.—directly at the antenna) and digitization by said system 100 of the antenna signal. In further embodiments, the system 100 may include electronic equipment at the remote end 110 of the system 100 (ex.—portion of the system 100 which includes system components, such as phase modulator(s) 108, which is/are remotely located from the digital signal processor 122, mode-locked laser 102, etc./portion or section of system where the input is received) which may include/may be limited to an antenna low noise amplifier (LNA) and/or other control circuitry.

Figure 2:
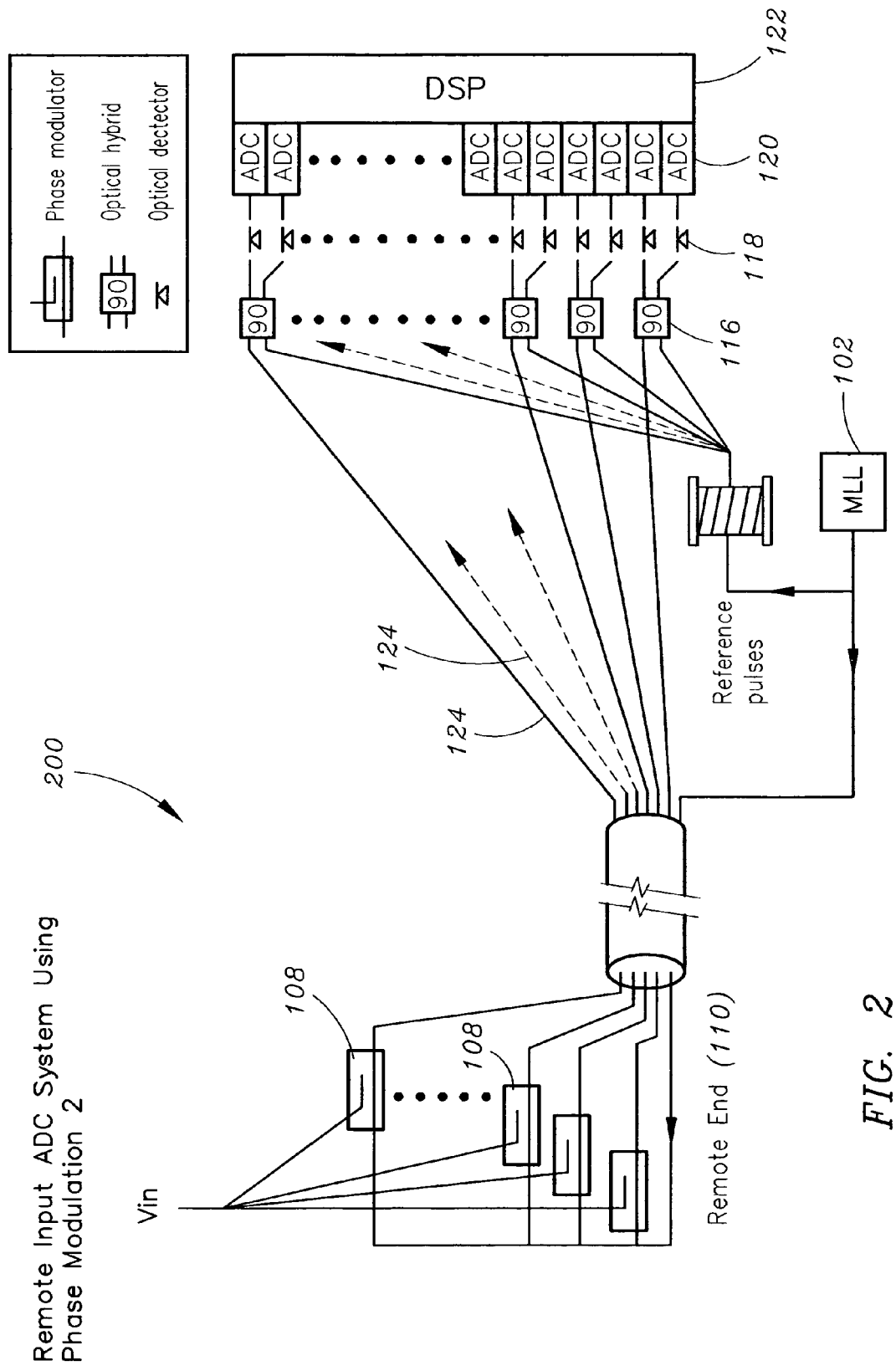
FIG. 2 is a block diagram schematic of a remote input analog-to-digital conversion (ADC) system in accordance with an alternative exemplary embodiment of the present invention.

Referring to FIG. 2, a remote input analog-to-digital conversion (ADC) system/remote sensing ADC system in accordance with an alternative exemplary embodiment of the present invention is shown. In the alternative illustrated embodiment, the system 200 includes a mode-locked laser (MLL) 102. The MLL 102 is configured for generating optical sampling pulses/optical pulses/an optical sampling pulse stream. In exemplary embodiments, the optical sampling pulses may be low jitter, short duration optical sampling pulses. Further, in current embodiments of the present invention, the optical sampling pulses may have a pulse width of approximately three picoseconds (3 ps).

In the alternative system 200, no multiplier circuit 104 is implemented, but rather the MLL 102 of system 200 may be connected to a plurality of phase modulators 108 of the system 200, said phase modulators 108 being located at a remote end 110 of the system 200. The MLL 102 may be configured for providing the optical sampling pulses to the phase modulators 108 at an optical pulse rate/pulse repetition rate/optical sampling rate. For example, the optical pulse rate may be 2.5 Gigahertz.

In further embodiments of the present invention, the phase modulators 108 may be connected to the MLL 102 and may be configured for receiving the optical sampling pulse stream from/via the MLL 102. Further, the phase modulators 108 may be configured for performing phase modulation of the optical sampling pulse stream (ex.—linearly imparting voltage information onto the optical sampling pulse stream) for providing phase modulated parallel optical pulses/phase-modulated parallel pulse stream(s). For instance, the voltage information may be provided via an input signal(s)/Remote Input(s)/Input Voltage/Antenna Signal(s)/Remote Signal(s)/Analog Signal(s)/Analog Optical Transmission(s)/RF signal(s) received by the system 200. In current embodiments of the present invention, the phase modulators 108 of the system 200 may use a number of parallel channels/fibers 124 with delays introduced such that the input voltage is effectively sampled at 40 GHz when all channels 124 are taken into account. In exemplary embodiments, the phase modulators 108 may be a highly linear, broadband phase modulators 108 which may use the electro-optic effect in materials such as lithium niobate. In the embodiment of the system 200 shown in FIG. 2, no optical switching tree/de-serializer is required because each fiber 124 may transmit/contain a 2.5 GHz phase-modulated parallel pulse stream.

In current embodiments of the present invention, the system 200 may further include one or more optical hybrids 116 (ex.—90 degree optical hybrids) connected to the phase modulators 108. The optical hybrids 116 may be configured for receiving the phase-modulated parallel pulse streams from the phase modulators 108 via the fibers 124. The MLL 102 is connected to the optical hybrids 116 and is configured for generating reference pulses. The optical hybrids 116 may be configured for receiving the reference pulses and for utilizing said reference pulses to demodulate the parallel pulse streams/parallel signals. Further, said reference pulses may be utilized by the system 200 to IQ detect the parallel pulse streams/parallel signals/optical pulses. Still further, the optical hybrids 116 are configured for outputting demodulated signals (ex.—I and Q signals/I and Q), said demodulated signals based upon/derived from the parallel pulse streams/parallel signals. In additional embodiments, the system 200 may further include a plurality of optical detectors 118. Further, the optical detectors 118 may be connected to the optical hybrids 116. Still further, the optical detectors 118 may be configured for receiving the demodulated signals/I and Q signals from/via the optical hybrids 116 (ex.—may be configured for detecting the demodulated signals).

In exemplary embodiments, the system 200 may further include a plurality of Analog-to-Digital Converters (ADCs) 120. The ADCs 120 may be connected to the optical detectors 118. Further, the ADCs 120 may be configured for receiving the detected demodulated signals (ex.—detected I and Q signals) from/via the optical detectors 118. Each optical hybrid 116 of the system 200 outputs a pair of signals (ex.—an I signal and a Q signal/the I and Q signals/the demodulated signals). Further, each detector 118 of the system 200 may be configured for detecting/receiving an I signal or a Q signal from/via the optical hybrids 116 and for providing the detected I signal or detected Q signal to an ADC 120 included in the plurality of ADCs 120. As mentioned above, each of the ADCs 120 may be configured for receiving the detected demodulated signals from/via the detectors 118. For instance, each ADC 120 may receive either a detected I signal or a detected Q signal from a detector 118 included in the plurality of detectors 118. Further, the ADCs 120 may be configured for converting the detected demodulated signals (ex.—analog detected demodulated signals) to digital signals. For example, each ADC 120 may receive either a detected I signal or a detected Q signal from a detector 118 included in the plurality of detectors 118 and may convert said detected I signal or detected Q signal to a digital signal. Thus, the ADCs 120 may convert the I and Q signals/the analog I and Q signals separately. In exemplary embodiments, the system 200 may include filters/networks/amplifiers connected between the detectors 118 and the ADCs 120, through which said detected demodulated signals may be directed prior to being received by the ADCs 120.

In current embodiments of the present invention, the system 200 may include a digital signal processor (DSP) 122. The digital signal processor 122 may be connected to the plurality of ADCs 120. Further, the ADCs 120 may be configured for providing the converted signals/digital signals to the digital signal processor 122, which may be configured for receiving the converted signals/the digital signals from/via the ADCs 120. In exemplary embodiments, the DSP 122 may be configured for calculating phase values based on the digital signals/the digitized I and Q signals and, based on said digital signals, the DSP 122 may further be configured for reconstructing the voltage information of the input signal/RF signal received (ex.—sampled) by said system 200.

Figure 3:
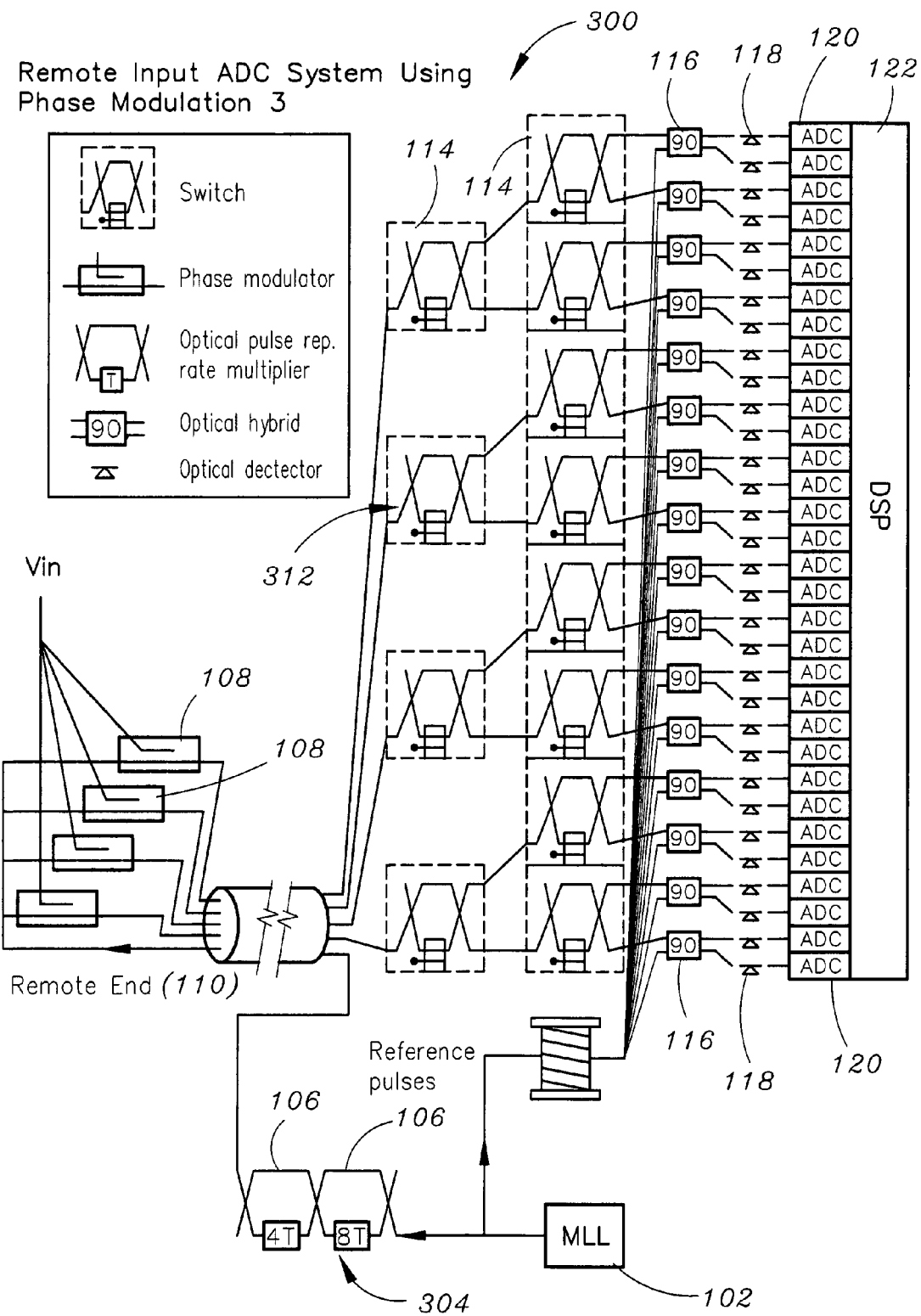
FIG. 3 is a block diagram schematic of a remote input analog-to-digital conversion (ADC) system in accordance with a further alternative exemplary embodiment of the present invention.

Referring to FIG. 3, a remote input analog-to-digital conversion (ADC) system/remote sensing ADC system in accordance with a further alternative exemplary embodiment of the present invention is shown. In the illustrated embodiment, the system 300 includes a mode-locked laser (MLL) 102. The MLL 102 is configured for generating optical sampling pulses/optical pulses/an optical sampling pulse stream. In exemplary embodiments, the optical sampling pulses may be low jitter, short duration optical sampling pulses. Further, in current embodiments of the present invention, the optical sampling pulses may have a pulse width of approximately three picoseconds (3 ps).

In current embodiments of the present invention, the system 300 may further include a multiplier circuit 304, which may be connected to the MLL 102. The multiplier circuit 304 may include one or more optical pulse repetition rate multipliers/cascaded pulse repetition rate multipliers/(split/delay/combine networks)/pulse repetition rate multipliers/repetition rate multiplier stages 106 (ex.—two multipliers). In further embodiments, the multiplier circuit 304 may be connected to a plurality of phase modulators 108 of the system 300, said phase modulators 108 being located at a remote end 110 of the system 300. The MLL 102 may be configured for providing the optical sampling pulses to the multiplier circuit 304 at a first optical pulse rate/first pulse repetition rate/first optical sampling rate. For example, the first optical pulse rate may be 2.5 Gigahertz.

In exemplary embodiments, the multiplier circuit 304 may be configured for receiving the optical sampling pulses/optical sampling pulse stream from/via the MLL 102 at the first optical pulse rate and transmitting/providing/outputting the optical sampling pulse stream/optical pulse stream at a second optical pulse rate/second optical sampling rate, said second optical pulse rate being greater than the first optical pulse rate. For example, the second optical pulse rate may be 10 GHz, while the first optical pulse rate (as mentioned above) may be 2.5 GHz. Thus, the multiplier circuit 104 may be configured for multiplying the optical pulse rate of the received optical sampling pulse stream, such that the first optical pulse rate (ex.—2.5 GHz) is increased to a second optical pulse rate (ex.—10 GHz) and providing/outputting the optical sampling pulse stream as a rate-multiplied optical sampling pulse stream. Further, the rate-multiplied optical sampling pulse stream may have a pulse period of one hundred picoseconds (T=100 ps).

In further embodiments of the present invention, the phase modulators 108 may be connected to the multiplier circuit 304 and may be configured for receiving the rate-multiplied optical sampling pulse stream from/via the multiplier circuit 304. Further, the phase modulators 108 may be configured for performing phase modulation of the rate-multiplied optical sampling pulse stream (ex.—linearly imparting voltage information onto the rate-multiplied optical sampling pulse stream) for providing phase modulated optical pulses/phase-modulated pulse streams. For instance, the voltage information may be provided via an input signal(s)/Remote Input(s)/Input Voltage/Antenna Signal(s)/Remote Signal(s)/Analog Signal(s)/Analog Optical Transmission(s)/RF signal(s) received by the system 300. In exemplary embodiments, the phase modulators 108 may be a highly linear, broadband phase modulator 108 which may use the electro-optic effect in materials such as lithium niobate. In current embodiments of the present invention, the phase modulators 108 of the system 300 may use a number of parallel channels/fibers 124 with delays introduced.

In exemplary embodiments, the system 300 may further include an optical demultiplexer switching tree(s)/an optical switching tree/de-serializer 312. The optical switching tree 312 may be connected to the phase modulator 108 and include one or more switches 114. In current embodiments of the present invention, the system 100 may further include one or more optical hybrids 116 (ex.—90 degree optical hybrids) connected to the optical switching tree 312.

In current embodiments of the present invention, the optical switching tree 312 may be configured for receiving the phase-modulated pulse streams from/via the phase modulators 108. The optical switching tree 312 may be further configured for outputting a plurality of parallel pulse streams based on/derived from (ex.—by splitting) the phase-modulated pulse stream(s) in order to obtain a desired aggregate sampling rate (ex.—40 GHz).

In further embodiments, each of the optical hybrid(s) 116 may be configured for receiving the parallel pulse stream(s) from/via the optical switching tree 312. The MLL 102 is connected to the optical hybrids and is configured for generating reference pulses. The optical hybrids 116 may be configured for receiving the reference pulses and for utilizing said reference pulses to demodulate the parallel pulse streams/parallel signals. Further, said reference pulses may be utilized by the system 100 to IQ detect the parallel pulse streams/parallel signals/optical pulses. Still further, the optical hybrids 116 are configured for outputting demodulated signals (ex.—I and Q signals/I and Q), said demodulated signals based upon/derived from the parallel pulse streams/parallel signals. In additional embodiments, the system 100 may further include a plurality of optical detectors 118. Further, the optical detectors 118 may be connected to the optical hybrids 116. Still further, the optical detectors 118 may be configured for receiving the demodulated signals/I and Q signals from/via the optical hybrids 116 (ex.—may be configured for detecting the demodulated signals).

In exemplary embodiments, the system 300 may further include a plurality of Analog-to-Digital Converters (ADCs) 120. The ADCs 120 may be connected to the optical detectors 118. Further, the ADCs 120 may be configured for receiving the detected demodulated signals (ex.—detected I and Q signals) from/via the optical detectors 118. Each optical hybrid 116 of the system 300 outputs a pair of signals (ex.—an I signal and a Q signal/the I and Q signals/the demodulated signals). Further, each detector 118 of the system 300 may be configured for detecting/receiving an I signal or a Q signal from/via the optical hybrids 116 and for providing the detected I signal or detected Q signal to an ADC 120 included in the plurality of ADCs 120. As mentioned above, each of the ADCs 120 may be configured for receiving the detected demodulated signals from/via the detectors 118. For instance, each ADC 120 may receive either a detected I signal or a detected Q signal from a detector 118 included in the plurality of detectors 118. Further, the ADCs 120 may be configured for converting the detected demodulated signals (ex.—analog detected demodulated signals) to digital signals. For example, each ADC 120 may receive either a detected I signal or a detected Q signal from a detector 118 included in the plurality of detectors 118 and may convert said detected I signal or detected Q signal to a digital signal. Thus, the ADCs 120 may convert the I and Q signals/analog I and Q signals separately. In exemplary embodiments, the system 300 may include filters/networks/amplifiers connected between the detectors 118 and the ADCs 120, through which said detected demodulated signals may be directed prior to being received by the ADCs 120.

In current embodiments of the present invention, the system 300 may include a digital signal processor (DSP) 122. The digital signal processor 122 may be connected to the plurality of ADCs 120. Further, the ADCs 120 may be configured for providing the converted signals/digital signals to the digital signal processor 122, which may be configured for receiving the converted signals/the digital signals from/via the ADCs 120. In exemplary embodiments, the DSP 122 may be configured for calculating phase values based on the digital signals/the digitized I and Q signals and, based on said digital signals, the DSP 122 may further be configured for reconstructing the voltage information of the input signal/RF signal received (ex.—sampled) by said system 300.

In alternative embodiments, optical hybrids 118 may be placed/connected/implemented at different locations in the systems 100, 200, 300 shown above. For instance, in some embodiments, the optical hybrids 118 may be placed/connected before the optical switching tree 112 (ex.—between the phase modulator 108 and the optical switching tree 112).

FIG. 4 is a table illustrating a power dissipation comparison for different implementations of the system of the present invention. The power dissipation comparison is an approximate power dissipation comparison which assumes that the elements included dominate and that the LNA dissipation increases linearly as the number of phase modulators 108 increases.

Figure 5A:
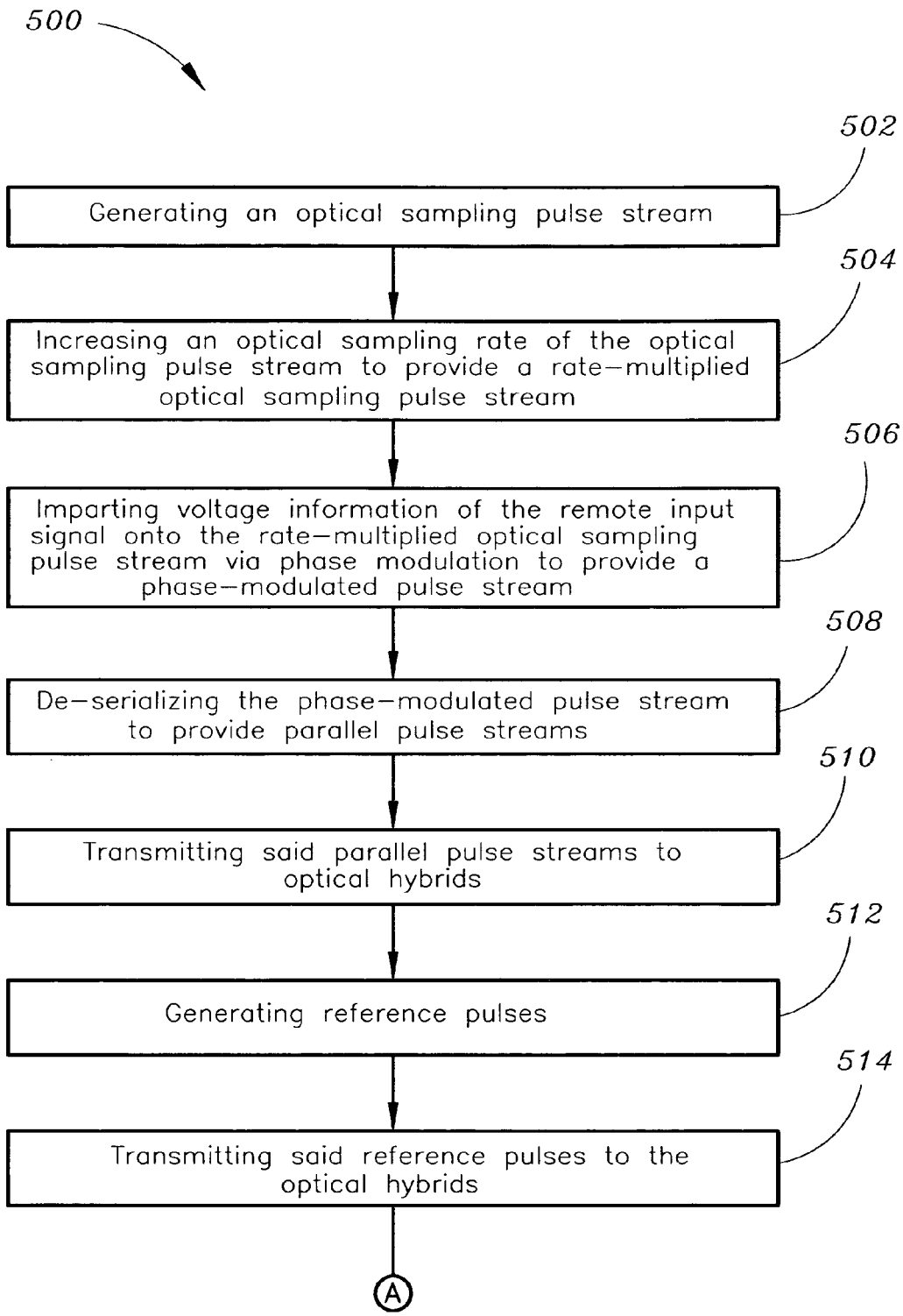
FIGS. 5A and 5B are flowcharts illustrating a method for sampling a remote input signal via a remote input analog-to-digital conversion (ADC) system in accordance with an exemplary embodiment of the present invention.
Figure 5B:
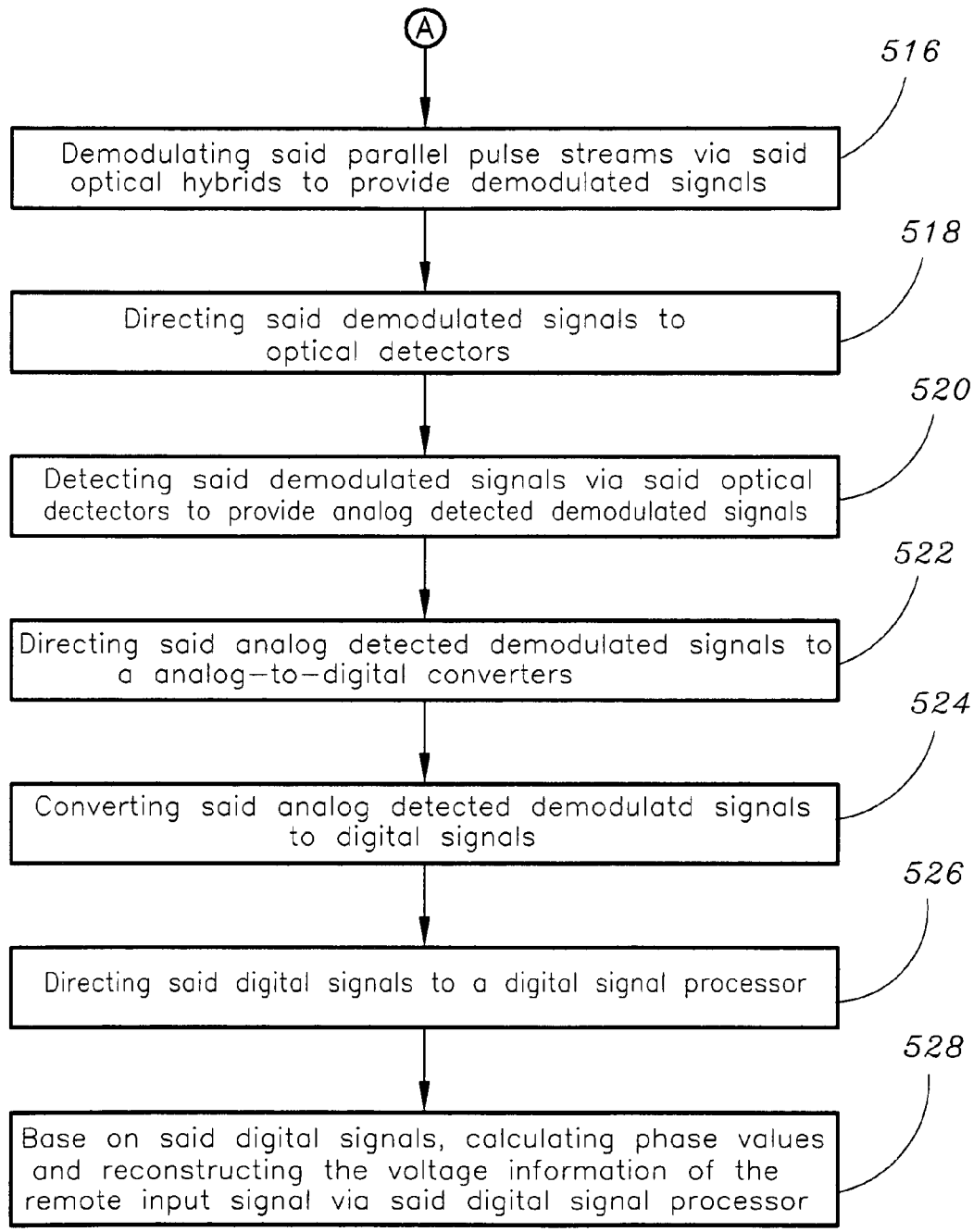

FIGS. 5A and 5B are flowcharts illustrating a method for sampling a remote input signal via a remote input analog-to-digital conversion (ADC) system (ex.—such as via the system 100 shown in FIG. 1) in accordance with an exemplary embodiment of the present invention. The method 500 may include the step of generating an optical sampling pulse stream, said optical sampling pulse stream having a first optical sampling rate 502. The method 500 may further include the step of increasing said first optical sampling rate of the optical sampling pulse stream to a second optical sampling rate to provide a rate-multiplied optical sampling pulse stream 504. The method 500 may further include the step of imparting voltage information of the remote input signal onto the rate-multiplied optical sampling pulse stream via phase modulation to provide a phase-modulated pulse stream 506. The method 500 may further include the step of de-serializing the phase-modulated pulse stream (ex.—via the optical demultiplexer switching tree) to provide a plurality of parallel pulse streams 508.

In exemplary embodiments, the method 500 may further include the step of transmitting said parallel pulse streams to a plurality of optical hybrids of the system 510. The method 500 may further include the steps of generating reference pulses 512 and transmitting said reference pulses to the plurality of optical hybrids 514. The method 500 may further include the step of demodulating said parallel pulse streams via said optical hybrids to provide a plurality of demodulated signals 516. The method 500 may further include the step of directing said demodulated signals to a plurality of optical detectors of the system 518. The method 500 may further include the step of detecting said demodulated signals via said optical detectors to provide analog detected demodulated signals 520. The method 500 may further include the step of directing said analog detected demodulated signals to a plurality of analog-to-digital converters of the system 522. The method 500 may further include the step of converting said analog detected demodulated signals to digital signals 524. The method 500 may further include the step of directing said digital signals to a digital signal processor of the system 526. The method 500 may further include the step of, based on said digital signals, calculating phase values and reconstructing the voltage information of the remote input signal via said digital signal processor 528.

Figure 6A:
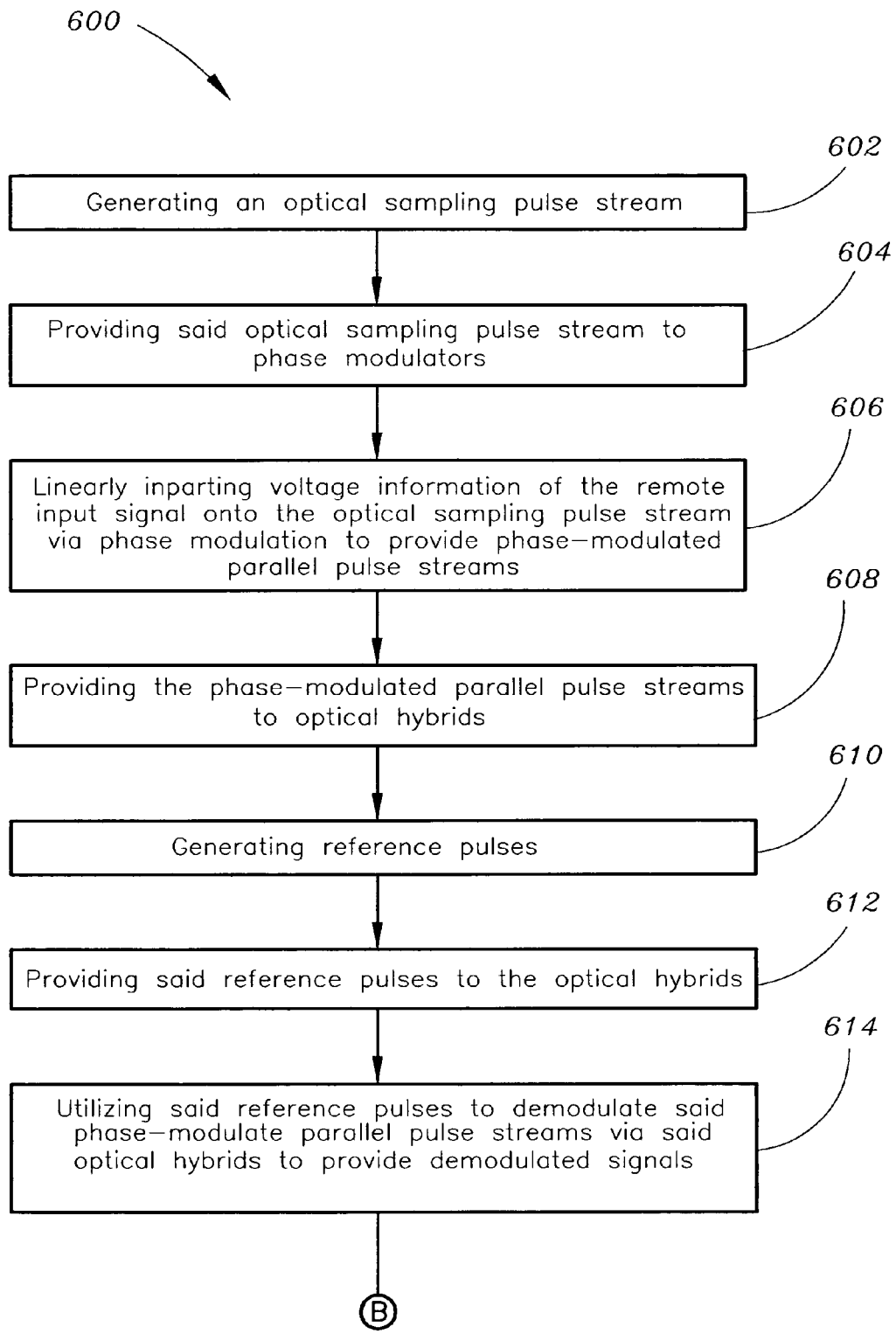
FIGS. 6A and 6B are flowcharts illustrating a method for sampling a remote input signal via a remote input analog-to-digital conversion (ADC) system in accordance with an alternative exemplary embodiment of the present invention.
Figure 6B:
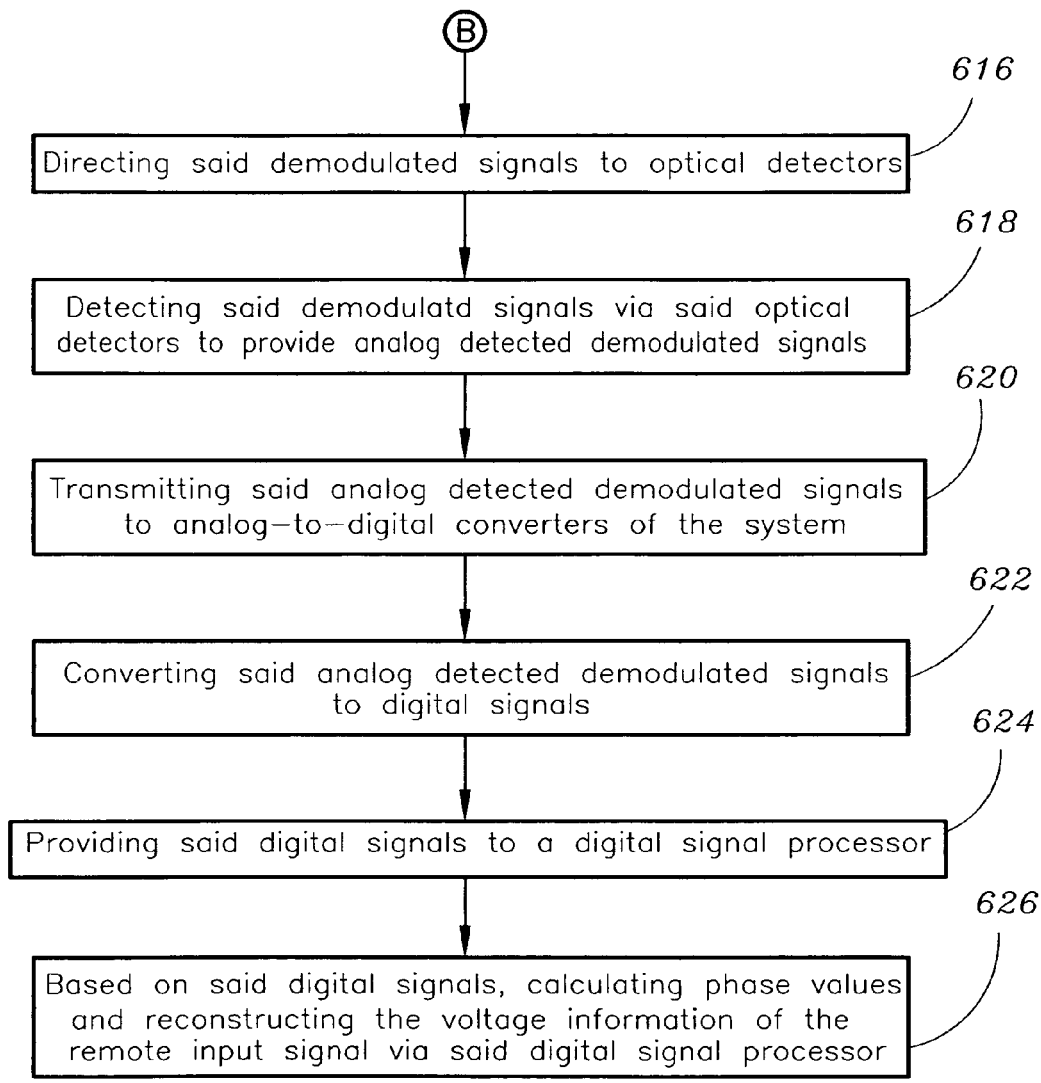

FIGS. 6A and 6B are flowcharts illustrating a method for sampling a remote input signal via a remote input analog-to-digital conversion (ADC) system (ex.—such as via the system 200 shown in FIG. 2) in accordance with an exemplary embodiment of the present invention. The method 600 may include the step of generating an optical sampling pulse stream 602. The method 600 may further include the step of providing said optical sampling pulse stream to a plurality of phase modulators of the system 604. The method 600 may further include the step of linearly imparting voltage information of the remote input signal onto the optical sampling pulse stream via phase modulation to provide a plurality of phase-modulated parallel pulse streams 606. The method 600 may further include the step of providing the phase-modulated parallel pulse streams to a plurality of optical hybrids of the system 608.

In exemplary embodiments, the method 600 may further include the step of generating reference pulses 610. The method 600 may further include the step of providing said reference pulses to the plurality of optical hybrids 612. The method 600 may further include the step of utilizing said reference pulses to demodulate said phase-modulated parallel pulse streams via said optical hybrids to provide a plurality of demodulated signals 614. The method 600 may further include the step of directing said demodulated signals to a plurality of optical detectors of the system 616. The method 600 may further include the step of detecting said demodulated signals via said optical detectors to provide analog detected demodulated signals 618. The method 600 may further include the step of transmitting said analog detected demodulated signals to a plurality of analog-to-digital converters of the system 620. The method 600 may further include the step of converting said analog detected demodulated signals to digital signals 622. The method 600 may further include the step of providing said digital signals to a digital signal processor of the system 624. The method 600 may further include the step of, based on said digital signals, calculating phase values and reconstructing the voltage information of the remote input signal via said digital signal processor 626.

Figure 7A:
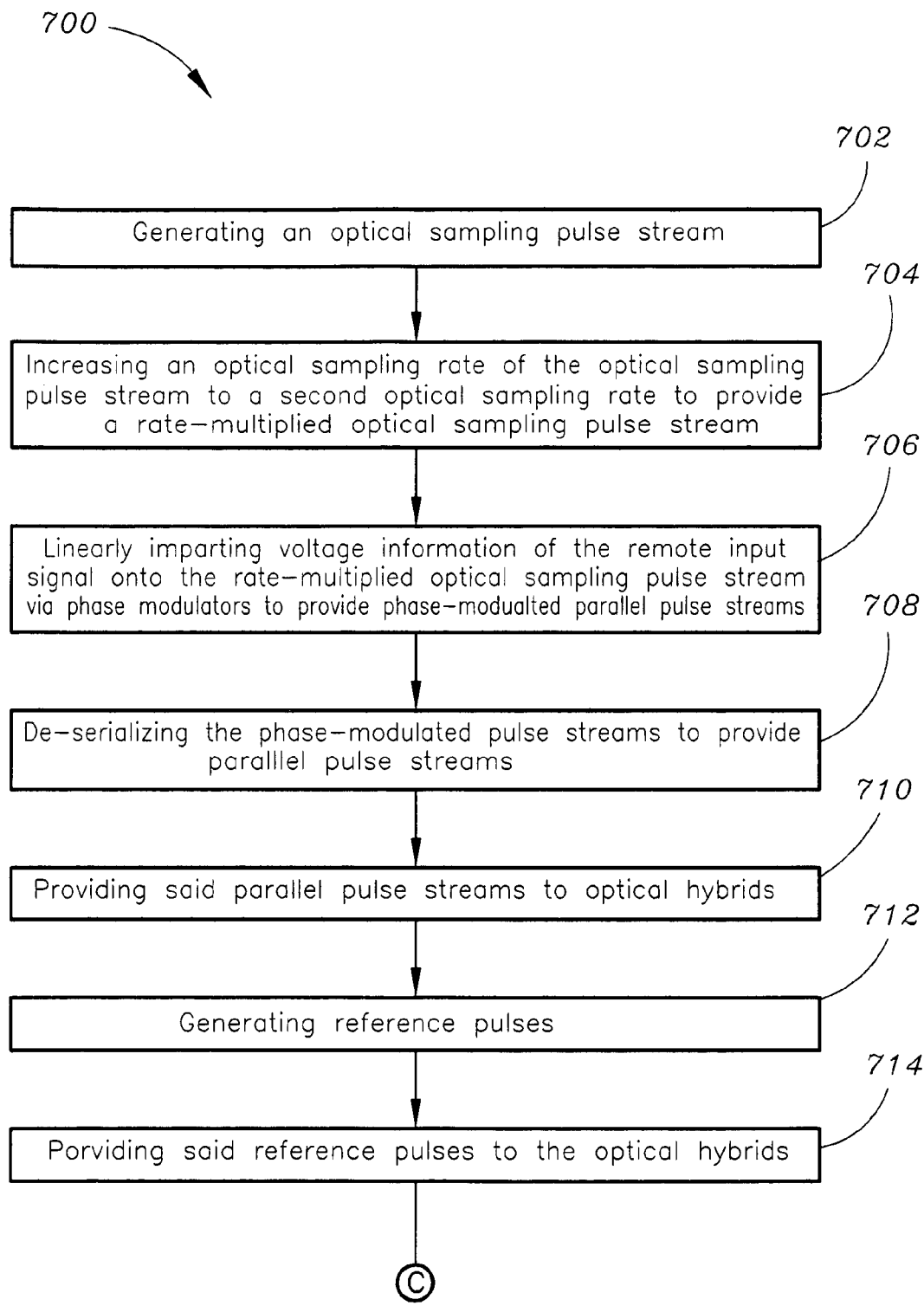
FIGS. 7A and 7B are flowcharts illustrating a method for sampling a remote input signal via a remote input analog-to-digital conversion (ADC) system in accordance with a further alternative exemplary embodiment of the present invention.
Figure 7B:
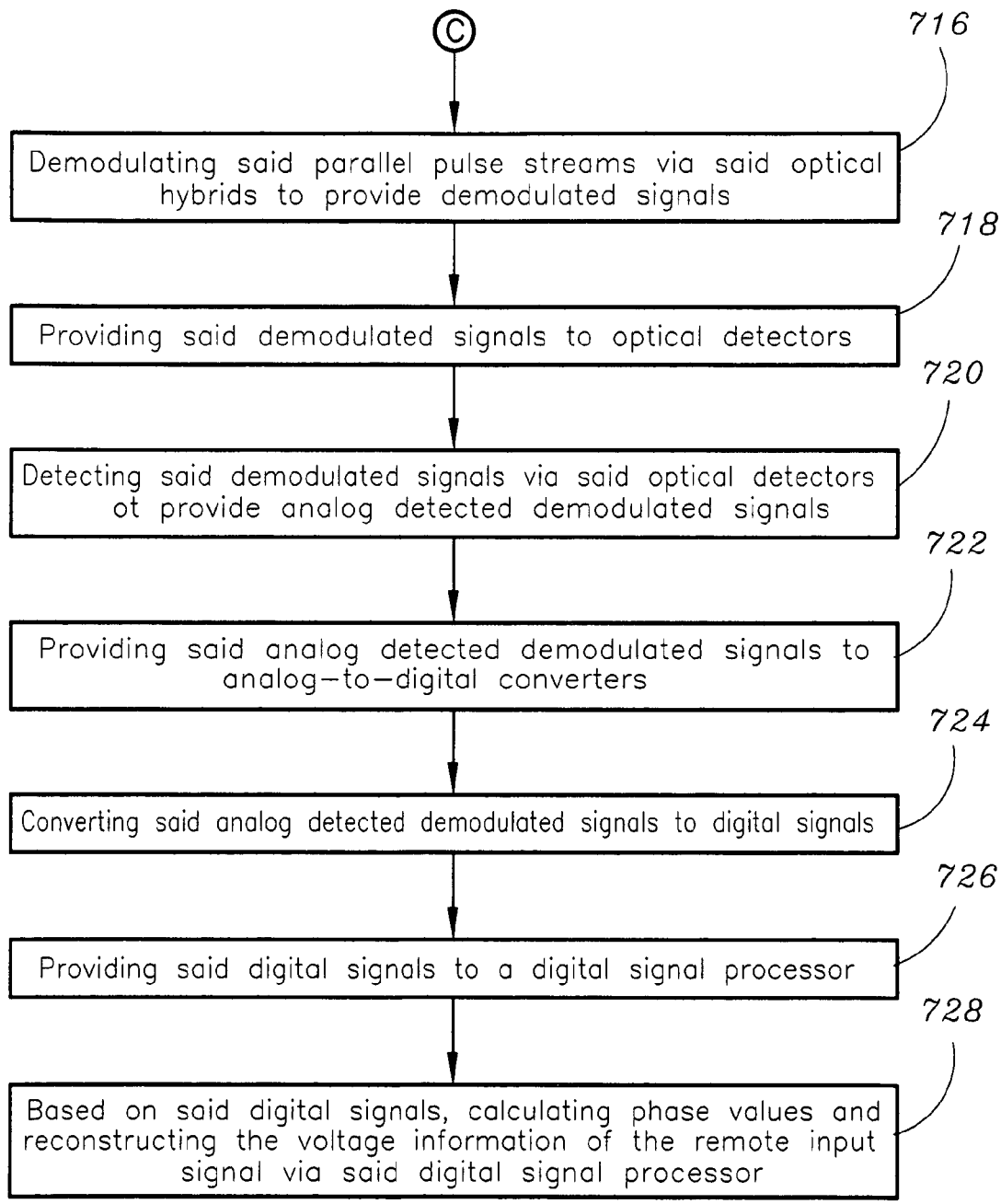

FIGS. 7A and 7B are flowcharts illustrating a method for sampling a remote input signal via a remote input analog-to-digital conversion (ADC) system (ex.—such as via the system 300 shown in FIG. 3) in accordance with an exemplary embodiment of the present invention. The method 700 may include the step of generating an optical sampling pulse stream, said optical sampling pulse stream having a first optical sampling rate 702. The method 700 may further include the step of increasing said first optical sampling rate of the optical sampling pulse stream to a second optical sampling rate to provide a rate-multiplied optical sampling pulse stream 704. The method 700 may further include the step of linearly imparting voltage information of the remote input signal onto the rate-multiplied optical sampling pulse stream via a plurality of phase modulators to provide a plurality of phase-modulated parallel pulse streams 706. The method 700 may further include the step of de-serializing the phase-modulated pulse stream to provide a plurality of parallel pulse streams 708.

In exemplary embodiments, the method 700 may further include the step of providing said parallel pulse streams to a plurality of optical hybrids of the system 710. The method 700 may further include the step of generating reference pulses 712. The method 700 may further include the step of providing said reference pulses to the plurality of optical hybrids 714. The method 700 may further include the step of demodulating said parallel pulse streams via said optical hybrids to provide a plurality of demodulated signals 716. The method 700 may further include the step of providing said demodulated signals to a plurality of optical detectors of the system 718. The method 700 may further include the step of detecting said demodulated signals via said optical detectors to provide analog detected demodulated signals 720. The method 700 may further include the step of providing said analog detected demodulated signals to a plurality of analog-to-digital converters of the system 722. The method 700 may further include the step of converting said analog detected demodulated signals to digital signals 724. The method 700 may further include the step of providing said digital signals to a digital signal processor of the system 726. The method 700 may further include the step of, based on said digital signals, calculating phase values and reconstructing the voltage information of the remote input signal via said digital signal processor 728.

It is to be noted that the foregoing described embodiments according to the present invention may be conveniently implemented using conventional general purpose digital computers programmed according to the teachings of the present specification, as will be apparent to those skilled in the computer art. Appropriate software coding may readily be prepared by skilled programmers based on the teachings of the present disclosure, as will be apparent to those skilled in the software art.

It is to be understood that the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for sampling a remote input signal via a remote input analog-to-digital conversion (ADC) system, comprising:
   generating an optical sampling pulse stream, said optical sampling pulse stream having a first optical sampling rate;
   increasing said first optical sampling rate of the optical sampling pulse stream to a second optical sampling rate to provide a rate-multiplied optical sampling pulse stream;
   imparting voltage information of the remote input signal onto the rate-multiplied optical sampling pulse stream via phase modulation to provide a phase-modulated pulse stream; and
   de-serializing the phase-modulated pulse stream to provide a plurality of parallel pulse streams.

2. A method as claimed in claim 1, further comprising:
   transmitting said parallel pulse streams to a plurality of optical hybrids of the system.

3. A method as claimed in claim 2, further comprising:
   generating reference pulses; and
   transmitting said reference pulses to the plurality of optical hybrids.

4. A method as claimed in claim 3, further comprising:
   demodulating said parallel pulse streams via said optical hybrids to provide a plurality of demodulated signals.

5. A method as claimed in claim 4, further comprising:
   directing said demodulated signals to a plurality of optical detectors of the system.

6. A method as claimed in claim 5, further comprising:
   detecting said demodulated signals via said optical detectors to provide analog detected demodulated signals.

7. A method as claimed in claim 6, further comprising:
   directing said analog detected demodulated signals to a plurality of analog-to-digital converters of the system.

8. A method as claimed in claim 7, further comprising:
   converting said analog detected demodulated signals to digital signals.

9. A method as claimed in claim 8, further comprising:
   directing said digital signals to a digital signal processor of the system.

10. A method as claimed in claim 9, further comprising:
    based on said digital signals, calculating phase values and reconstructing the voltage information of the remote input signal via said digital signal processor.

11. A method for sampling a remote input signal via a remote input analog-to-digital conversion (ADC) system, comprising:
    generating an optical sampling pulse stream;
    providing said optical sampling pulse stream to a plurality of phase modulators of the system;
    linearly imparting voltage information of the remote input signal onto the optical sampling pulse stream via phase modulation to provide a plurality of phase-modulated parallel pulse streams; and
    providing the phase-modulated parallel pulse streams to a plurality of optical hybrids of the system.

12. A method as claimed in claim 11, further comprising:
    generating reference pulses;
    providing said reference pulses to the plurality of optical hybrids;
    utilizing said reference pulses to demodulate said phase-modulated parallel pulse streams via said optical hybrids to provide a plurality of demodulated signals;
    directing said demodulated signals to a plurality of optical detectors of the system;
    detecting said demodulated signals via said optical detectors to provide analog detected demodulated signals;
    transmitting said analog detected demodulated signals to a plurality of analog-to-digital converters of the system;
    converting said analog detected demodulated signals to digital signals;
    providing said digital signals to a digital signal processor of the system; and
    based on said digital signals, calculating phase values and reconstructing the voltage information of the remote input signal via said digital signal processor.

13. A method for sampling a remote input signal via a remote input analog-to-digital conversion (ADC) system, comprising:
    generating an optical sampling pulse stream, said optical sampling pulse stream having a first optical sampling rate;
    increasing said first optical sampling rate of the optical sampling pulse stream to a second optical sampling rate to provide a rate-multiplied optical sampling pulse stream;
    linearly imparting voltage information of the remote input signal onto the rate-multiplied optical sampling pulse stream via a plurality of phase modulators to provide a plurality of phase-modulated parallel pulse streams; and
    de-serializing the phase-modulated pulse streams to provide a plurality of parallel pulse streams.

14. A method as claimed in claim 13, further comprising:
    providing said parallel pulse streams to a plurality of optical hybrids of the system;
    generating reference pulses;
    providing said reference pulses to the plurality of optical hybrids;
    demodulating said parallel pulse streams via said optical hybrids to provide a plurality of demodulated signals;
    providing said demodulated signals to a plurality of optical detectors of the system;
    detecting said demodulated signals via said optical detectors to provide analog detected demodulated signals;
    providing said analog detected demodulated signals to a plurality of analog-to-digital converters of the system;
    converting said analog detected demodulated signals to digital signals; and
    providing said digital signals to a digital signal processor of the system.

15. A method as claimed in claim 14, further comprising:
    based on said digital signals, calculating phase values and reconstructing the voltage information of the remote input signal via said digital signal processor.

16. A remote input analog-to-digital conversion (ADC) system, comprising:
- a mode-locked laser, said mode-locked laser configured for generating and transmitting an optical sampling pulse stream, said optical sampling pulse stream having a first optical sampling rate;
- a multiplier circuit, said multiplier circuit connected to the mode-locked laser, said multiplier circuit configured for receiving the transmitted optical sampling pulse stream and for increasing said first optical sampling rate of the optical sampling pulse stream to a second optical sampling rate to provide a rate-multiplied optical sampling pulse stream;
- a phase modulator, said phase modulator being remotely located from the multiplier circuit and being connected to the multiplier circuit, said phase modulator configured for receiving the rate-multiplied optical sampling pulse stream, said phase modulator further configured for imparting voltage information of a remote input signal onto the rate-multiplied optical sampling pulse stream to provide a phase-modulated pulse stream, wherein said remote input signal is received by the system; and
- an optical demultiplexer switching tree, said optical demultiplexer switching tree being connected to the phase modulator and being configured for de-serializing the phase-modulated pulse stream to provide a plurality of parallel pulse streams.

17. A system as claimed in claim 16, further comprising:
a plurality of optical hybrids, said optical hybrids being connected to the switching tree and being configured for receiving the parallel pulse streams via the switching tree, said optical hybrids further being connected to the mode-locked laser and being configured for receiving reference pulses from the mode-locked laser, said optical hybrids further configured for utilizing the reference pulses to demodulate the parallel pulse streams to provide a plurality of demodulated signals.

18. A system as claimed in claim 17, further comprising:
a plurality of optical detectors, said optical detectors being connected to the plurality of optical hybrids and being configured for detecting the demodulated signals to provide analog detected demodulated signals.

19. A system as claimed in claim 18, further comprising:
a plurality of analog-to-digital converters, said analog-to-digital converters being connected to the plurality of optical detectors, said converters being configured for converting said analog detected demodulated signals to digital signals.

20. A system as claimed in claim 19, further comprising:
a digital signal processor, said digital signal processor being connected to the plurality of converters, said processor being configured for, based on said digital signals, calculating phase values and reconstructing the voltage information of the remote input signal.

* * * * *